United States Patent
Thomas

[19]

[11] Patent Number: 6,140,883
[45] Date of Patent: *Oct. 31, 2000

[54] TUNABLE, ENERGY EFFICIENT CLOCKING SCHEME

[75] Inventor: Thomas P. Thomas, Beaverton, Oreg.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/953,054

[22] Filed: Oct. 17, 1997

[51] Int. Cl.[7] .................................................. H03L 7/00
[52] U.S. Cl. ..................... 331/36 C; 331/117 R; 331/60; 331/108 C; 331/74; 327/147; 326/93; 326/101; 713/503
[58] Field of Search ................................ 331/60, 117 R, 331/108 C, 74, 36 C; 326/93, 101; 327/147, 48, 49; 713/503; 375/376

[56] References Cited

U.S. PATENT DOCUMENTS

| | | | |
|---|---|---|---|
| 4,667,170 | 5/1987 | Lofgren et al. | 331/17 |
| 5,420,544 | 5/1995 | Ishibashi | 331/11 |
| 5,838,207 | 11/1998 | Zhou et al. | 331/36 C |

*Primary Examiner*—Arnold Kinkead
*Attorney, Agent, or Firm*—Blakely, Sokoloff, Taylor & Zafman LLP

[57] ABSTRACT

Briefly, in accordance with one embodiment of the invention, a circuit includes: a voltage tunable inductive-capacitive (LC) oscillator, a charge pump, and a phase detector. The oscillator, detector, and charge pump are coupled together to form a PLL.

13 Claims, 3 Drawing Sheets

*(PRIOR ART CLOCKING SCHEME)*

*(PRIOR ART PLL)*

6,140,883

TUNABLE, ENERGY EFFICIENT CLOCKING SCHEME

BACKGROUND

1. Field of the Invention

The present invention relates to a clocking scheme for electronic circuitry, such as phase-locked loops (PLL).

2. Background Information

In large chips employing binary digital signals or bits, such as, without limitation, microprocessors, microcontrollers, digital signal processors, ASICs and others, a significant amount of power is dissipated due to the clock signal driving the chip components. More specifically, the clock signal is typically distributed via a clock tree network. The clock signal drives a relatively large value of capacitance due to the presence of input capacitances for the devices used to construct register and latches, for example. Without limitation, a capacitance might be approximately in the range of a nanofarad to tens or hundreds of nanofarads, for example.

Typically, the clock signal is produced using a phase-locked loop (PLL) FIG. 3 is a schematic diagram illustrating a conventional phase-locked loop. Likewise, this particular PLL comprises a charge pump PLL. As illustrated in FIG. 3, a voltage-controlled oscillator (VCO) 310 produces a VCO output clock signal C2. VCO output clock signal C2 may be fed back directly or through a divider 320 (shown using a dotted line) if frequency multiplication is employed, although the following discussion assumes no divider. Phase detector 330 compares the phase and frequency of VCO clock signal C2 with the phase and frequency of reference clock signal C1. Based upon the phase delay between the two clock signals, phase detector 330 produces an up signal and a down signal. These different signals are produced by different output ports of phase detector 330. As illustrated in FIG. 3, these up and down signals are applied to control switches of a charge pump that will short circuit an electrical path including a current source, such as current sources 340 and 350. Thus, as illustrated in FIG. 3, when these switches close, current flow charges or discharges capacitor 360. Therefore, depending upon the duration of the up signal and the down signal produced by phase detector 330, the voltage of capacitor 360 may be adjusted. By adjusting the duration of the signals applied, the voltage across capacitor 360 may either increase or decrease. Furthermore, as illustrated in FIG. 3, capacitor 360 is coupled to voltage-control oscillator 310 so that the frequency of the output clock signal produced by VCO 310 will be adjusted in response to the voltage across capacitor 360. Therefore, a delay between VCO clock signal C2 and reference clock signal C1 should become smaller based, at least in part, on the negative feedback operation of the PLL. When the output clock signal of VCO 310 closely matches reference clock signal C1 in phase and frequency, the PLL is "locked".

In this embodiment, block 345 is referred to as a charge pump, although block 340 also includes a filter in the form capacitor 360, and in some embodiments the filter is indicated separately from the charge pump. Likewise, in this context, the term charge pump refers to any circuit that produces a VCO control voltage based at least in part on the phase detector output signal. Furthermore, this term is employed in this context even if the circuit is entirely digital.

FIG. 2 illustrates the basic structure of a conventional clock tree 200 to distribute the clock signal to the chip components. In FIG. 2, 210 comprises a PLL, such as previously discussed with reference to FIG. 3. As illustrated, a feedback clock signal and a reference clock signal are applied to PLL 210. This clock tree has a number of drivers, such as 220, 230, 240, 250, 260, 270 and 280, and may progressively get larger, to drive large capacitances, such as attributable to registers and latches, with the output signal of the voltage-controlled oscillator of the phase-locked loop (PLL). These drivers typically contain inverters (not shown). Hence, the capacitances are being switched at the clock frequency. The capacitances illustrated in FIG. 2 as 265, 275, 285, 290, 295 and 255 are the capacitances attributable to the components of the chip, in this example. In addition to these capacitances, the gate capacitances of the driver inverters are also switching at the clock frequency. If the total capacitance for the clock network is represented as C and the clock network switches at the clock frequency, f, the amount of power dissipated may be represented as $CV^2f$, where V is the supply voltage. This amount of power may be a significant portion of the total power utilized by the chip due to a relatively large C and a relatively high f. A need, therefore, exists for a technique of reducing the amount of power dissipated in a chip employing digital circuitry, due to the particular clocking scheme employed.

SUMMARY

Briefly, in accordance with one embodiment of the invention, a circuit includes: a voltage tunable inductive-capacitive (LC) oscillator, a charge pump, and a phase detector. The oscillator, detector, and charge pump are coupled together to form a PLL.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description, when read with the accompanying drawings, in which:

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Figure 1:
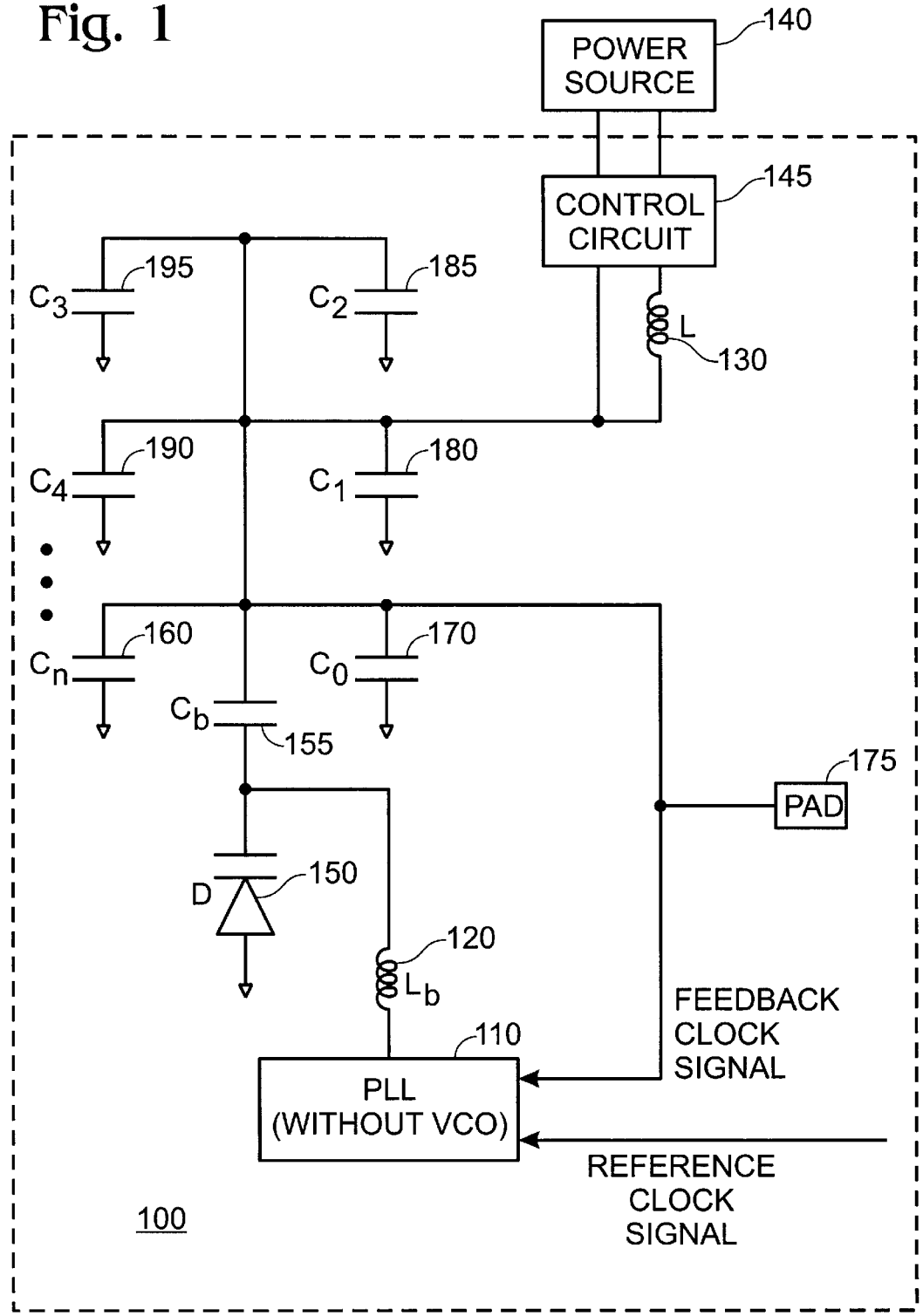
FIG. 1 is a schematic diagram illustrating an embodiment of a PLL in accordance with the invention.

FIG. 1 is a schematic diagram illustrating an embodiment 100 of a PLL, including a voltage tunable oscillator, in accordance with the present invention. This PLL is illustrated as embodied on an integrated circuit (IC) chip. The invention is, of course, not restricted in scope to this particular embodiment. Likewise, in this particular embodiment, the voltage tunable oscillator is tuned by varying or adjusting an applied voltage to vary or adjust the capacitance of the voltage-controlled oscillator (VCO).

However, alternatively, the voltage tunable oscillator may be tuned by varying an applied voltage to vary the inductance, in an alternative embodiment. For example, varying the voltage may be employed to vary the position of the core of the inductor.

As illustrated, this particular embodiment includes a clock tree which comprises an inductive-capacitive or "LC" oscillator oscillating at its natural frequency. This particular oscillator is referred to as an "LC" oscillator because the frequency of the oscillations depend on the inductance and capacitance of the oscillator. Under ideal conditions, a "LC" oscillator dissipates no power due to zero resistance; however, practically speaking, some power is dissipated, such as due to the non-zero resistance of metal lines in the clock tree and the inductor, for example. Nonetheless, in comparison with a conventional PLL, power savings may be realized because the resistance of the oscillator is reduced to a sufficiently low value.

For example, as is well known, when an inductor and a capacitor are coupled in a circuit with an energy source, because the current and voltage of the inductor and the capacitor are out of phase with respect to one another, oscillations in the voltage signal are produced at a frequency determined by the inductance and capacitance, in this particular embodiment, and L and C respectively. Likewise, due to the small resistance in the circuit, these oscillations dampen and so energy may be introduced into the system to maintain or sustain the oscillations.

In the embodiment illustrated in FIG. 1, a low resistance short metal line is employed to couple the clock input port of a variety of registers and latches. As illustrated in FIG. 1 by capacitances 160, 170, 180, 190, 185 and 195, these input ports each have an associated capacitance. This capacitance, in combination with a low resistance, inductor 130 and varactor 150, forms an LC voltage-controlled oscillator (VCO). In this context, a varactor refers to a semiconductor device characterized by a voltage sensitive capacitance that resides in the junction of a reverse-biased region of a semiconductor, such as illustrated by the embodiment of FIG. 4, although the invention is not restricted in scope to use of a varactor or to this particular embodiment of a varactor.

Figure 4:
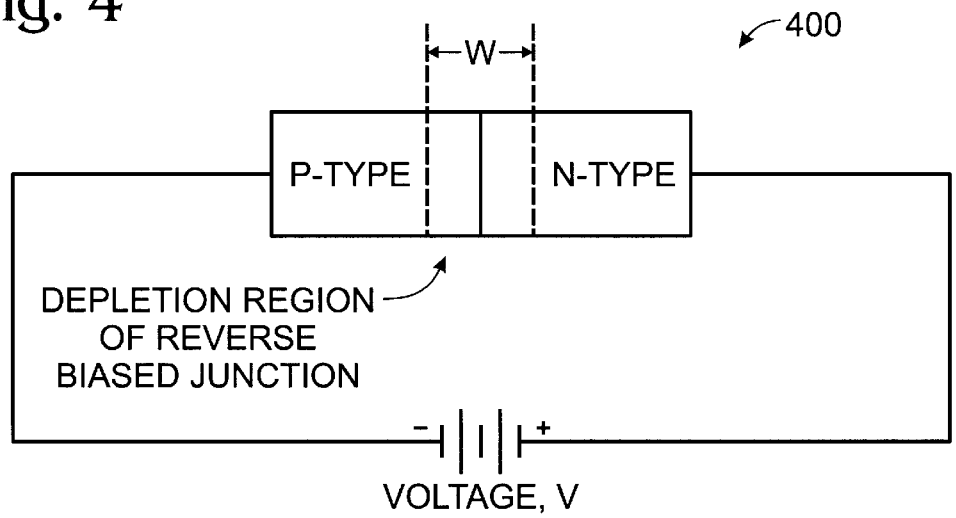
FIG. 4 is a schematic diagram illustrating an embodiment of a varactor.

A schematic diagram of an embodiment of a varactor is illustrated in FIG. 4. As illustrated, a varactor is similar to a semiconductor diode where a P-type material and an N-type material both being semiconductor material are brought into contact to form a P-N junction. Likewise, as illustrated, a depletion region is formed and, as illustrated, the depletion region has a width, indicated as w in FIG. 4. This width, as well as a number of other factors, determines the capacitance associated with the varactor. Likewise, depending upon the voltage applied across the P-N junction, the width, w, may either increase or decrease. The semiconductor material in this particular embodiment may be doped so that a linear variation in the applied voltage produces a substantially linear variation in the capacitance, although the invention is not limited in scope in this request.

Figure 2:
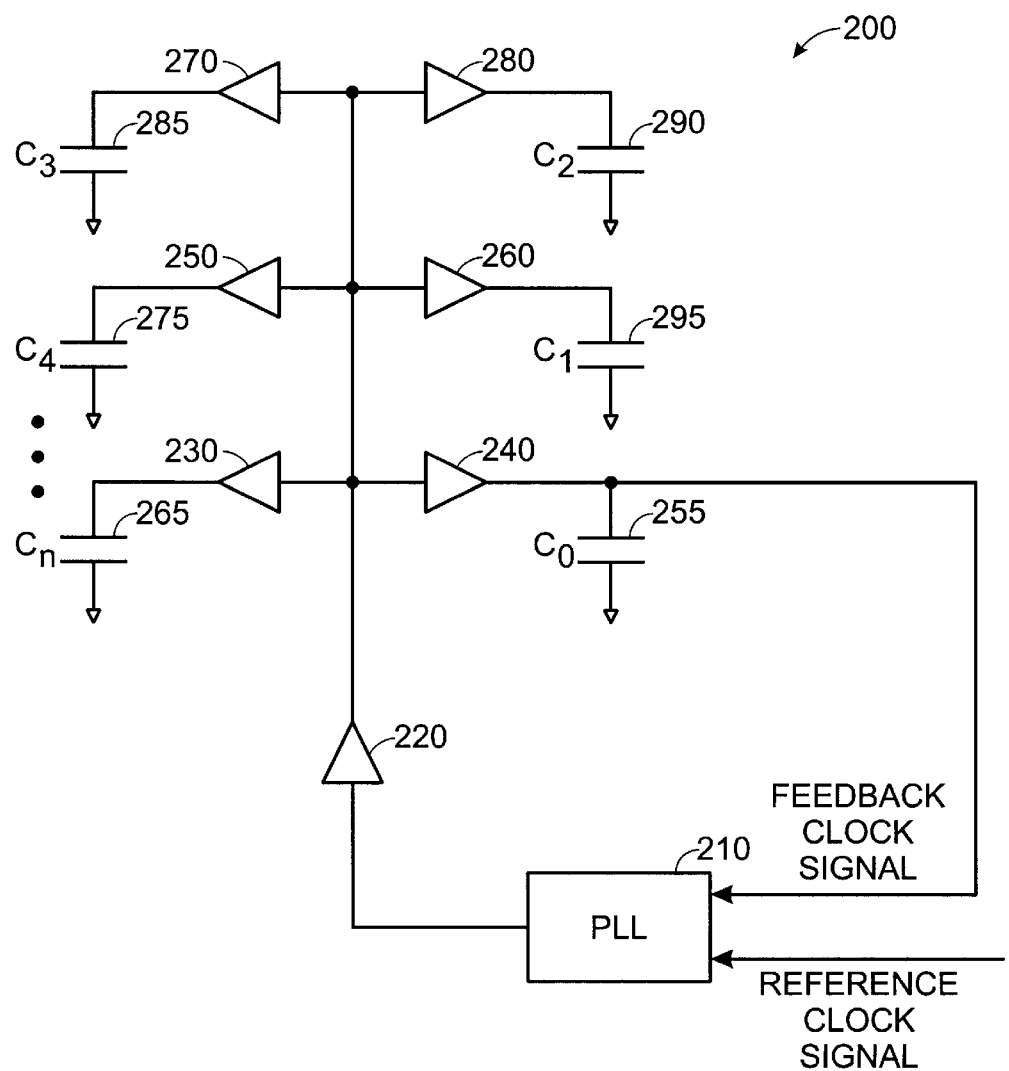
FIG. 2 is a schematic diagram illustrating an embodiment of a conventional clock tree.
Figure 3:
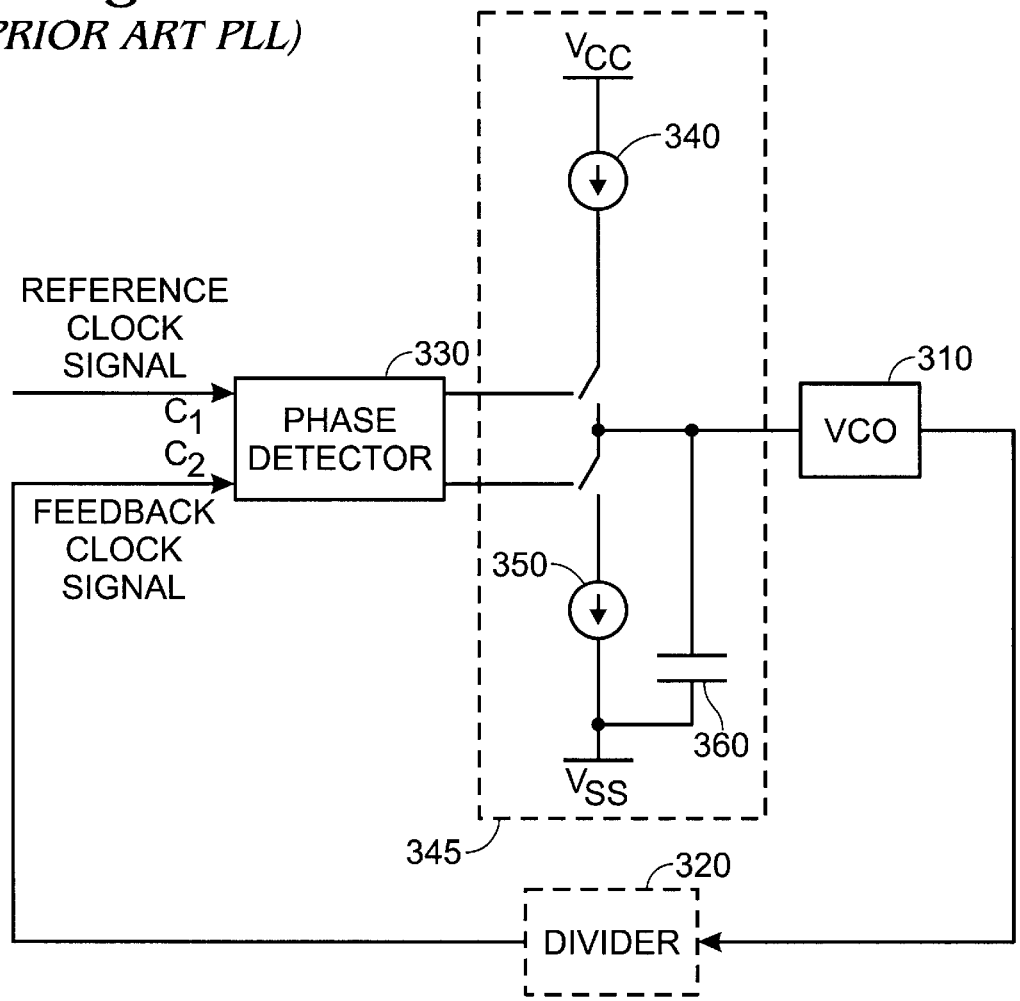
FIG. 3 is a schematic diagram illustrating an embodiment of a conventional PLL.

The conventional VCO of a PLL, such as illustrated in FIG. 2, for example, is replaced by the LC VCO of FIG. 1, including a control voltage applied to varactor 150. In the FIG. 1 embodiment, the LC VCO is not incorporated in PLL 110. In this embodiment, the capacitance of the VCO includes the sum of capacitances associated with the input ports, as previously described, and the varactor capacitance. In this particular embodiment, capacitor 155 comprises a large direct current (DC) blocking capacitor having capacitance $C_b$, in which the capacitance of capacitor 155 is significantly larger than the maximum attainable capacitance of varactor 150. In this embodiment, the non-zero resistance of the metal line(s) dampens the natural oscillations of the LC VCO and results in energy loss. However, DC energy source 140 supplies energy and sustains the oscillations at the natural frequency of the LC oscillator. Although the invention is not limited in scope in this respect, energy source 140 may comprise, for example, two switches coupled to a battery and operated by a control circuit. The clock or PLL may be stopped in this embodiment by turning off or decoupling the energy source. Also in this embodiment, a pad 175 is coupled to the clock tree for testing the chip, although, of course, this may be omitted. At relatively high frequencies, such as on the order of gigahertz, for example, it may be desirable for the inductor and varactor to be implemented on chip, whereas at low frequencies they may be externally coupled to pad 175, although, again, the invention is not limited in scope in this respect.

As previously explained, the capacitance associated with the clock tree may be represented as C. Likewise, inductor 130 has an inductance, denoted L in this particular embodiment. Inductor 120 provides AC blocking similar to the DC blocking provided by capacitor 155. However, because varactor 150 has a capacitance in parallel with C that varies with the applied voltage, the natural frequency of the LC VCO may be varied based, at least in part, on the difference in phase and frequency between the feedback clock signal and the reference clock signal applied to 110.

One advantage of the embodiment illustrated in FIG. 1, in comparison with alternative approaches, is the ability to tune the frequency of the clock signal without a significant loss in power. Being able to tune the frequency of the clock signal is a desirable advantage for phase locking, and also due to differences in temperature, manufacturing processes and other sources. Producing a chip having the precisely desired clock frequency is a difficult accomplishment. Therefore, it is desirable to be able to tune the frequency after manufacture. Likewise, other clocking schemes may provide the capability to tune the frequency of the clock signal; however, those approaches will typically result in significantly greater losses of power in comparison with the approach illustrated by this particular embodiment of the invention.

One embodiment of the method of tuning the frequency of a phase-locked loop (PLL) is as follows. As previously described, in one embodiment of a phase-locked loop in accordance with the invention, an inductive-capacitive (LC) oscillator includes a varactor. As previously described, a voltage applied across a varactor may be adjusted. As a result of adjusting the voltage across the varactor, the capacitance of the varactor is modified. This modification in the capacitance of the varactor modifies the capacitance of the oscillator and, this adjusts or tunes the frequency of the phase-locked loop circuit. Likewise, this adjustment of the applied voltage of the varactor may occur due to the negative feedback of the phase-locked loop. For example, depending upon the phase difference between the PLL output clock signal and a reference clock signal, a phase detector may apply signals to a charge pump and thereby adjust the voltage applied to the varactor. This has been described previously in greater detail and the invention is not restricted in scope to a particular phase-locked loop circuit embodiment. Likewise, the clock signal produced by the PLL may be applied to an integrated circuit (IC) chip including digital electronic circuitry. For example, as previously described, such a chip may include a microprocessor, a microcontroller, an ASIC, or other chips including digital electronic circuitry. Likewise, the IC chip may include a clock tree driven by the clock signal produced by the PLL and applied to the IC chip. Furthermore, as previously discussed, energy may be supplied to the PLL to substantially sustain the PLL oscillations. Likewise, the application of energy to the PLL may be timed so as to substantially sustain the PLL oscillations in a substantially square wave form. More specifically, as the signal oscillates, the energy may be applied at predetermined points of the signal so that a square wave or other signal form other than a sine wave, for example, is produced. Likewise, although the invention is not limited in scope in this respect, the applied voltage may be adjusted substantially linearly. As previously indicated, where the varactor is properly doped, this may result in a substantially linear variation in the capacitance, as may be desirable in particular embodiments.

While certain features of the invention have been illustrated and described herein, many modifications, substitutions, changes and equivalents will now occur to those skilled in the art. It is, therefore, to be understood that the appended claims are intended to cover all such modifications and changes as fall within the true spirit of the invention.

What is claimed is:

1. A circuit comprising:

a voltage tunable inductive-capacitive (LC) oscillator;

a phase detector;

and a charge pump;

said oscillator, detector, and charge pump being coupled together to form a PLL;

wherein said PLL is embodied on an integrated circuit (IC) including a processor;

said PLL being coupled to provide a clock signal driving a clock tree for said processor;

wherein the capacitance of the clock tree forms part of the capacitance of the LC oscillator.

2. The circuit of claim 1, wherein said voltage tunable LC oscillator includes a varactor capable of adjusting the capacitance of said oscillator in response to an applied voltage.

3. The circuit of claim 2, wherein said processor comprises a microprocessor.

4. The circuit of claim 2, wherein said varactor comprises an N-type semiconductor material in direct physical contact with a P-type semiconductor material to form a P-N semiconductor junction.

5. The circuit of claim 4, wherein said P-type and said N-type semiconductor material are doped so that linearly varying a voltage applied across said varactor substantially linearly varies the capacitance of the varactor.

6. A method of tuning the frequency of a phase-locked loop (PLL) including an inductive-capacitive (LC) oscillator with a varactor, comprising:

adjusting an applied voltage across the varactor; and applying a clock signal produced by the PLL to an integrated circuit (IC) chip including digital electronic circuitry having a clock tree, the capacitance of the clock tree forming part of the capacitance of the LC oscillator.

7. The method of claim 6, wherein said IC comprises a microprocessor.

8. The method of claim 6, and further comprising:

supplying energy to the PLL to substantially sustain the PLL oscillations.

9. The method of claim 8, wherein energy is supplied to the PLL to substantially sustain the PLL oscillations in a substantially square wave form.

10. The method of claim 6, wherein the applied voltage is adjusted substantially linearly.

11. A phase-locked loop (PLL) comprising:

a voltage tunable inductive-capacitive (LC) oscillator; a phase detector; a charge pump; and a frequency divider; said oscillator, detector, charge pump and divider being coupled so as to produce a PLL output clock signal;

said PLL circuit being incorporated on an integrated circuit (IC) chip and coupled so as to drive a clock tree for digital electronic circuitry;

the capacitance of the clock tree forming part of the capacitance of the LC oscillator.

12. The PLL of claim 11, wherein said voltage tunable LC oscillator includes a varactor.

13. The PLL of claim 12, wherein said PLL circuit is coupled so that during operation a voltage applied to said varactor by said charge pump affects the frequency of said PLL output clock signal.

* * * * *